United States Patent
Lim et al.

(10) Patent No.: US 8,045,667 B2
(45) Date of Patent: Oct. 25, 2011

(54) DESERIALIZER AND DATA RECOVERY METHOD

(75) Inventors: Han-Kyul Lim, Seoul (KR); Dong-Chul Choi, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 902 days.

(21) Appl. No.: 12/034,157

(22) Filed: Feb. 20, 2008

(65) Prior Publication Data

US 2008/0187084 A1    Aug. 7, 2008

(30) Foreign Application Priority Data

Feb. 2, 2007  (KR) .................. 10-2007-0017982
May 31, 2007  (KR) .................. 10-2007-0053403

(51) Int. Cl.
*H04L 7/00*   (2006.01)
*H04L 7/02*   (2006.01)
*H04L 7/04*   (2006.01)
*H03D 3/24*   (2006.01)

(52) U.S. Cl. ........ 375/371; 375/354; 375/355; 375/356; 375/357; 375/360; 375/362; 375/363; 375/365; 375/366; 375/368; 375/376

(58) Field of Classification Search .......... 375/354–357, 375/363, 365, 371, 376, 360, 362, 366, 368
See application file for complete search history.

(56) References Cited

U.S. PATENT DOCUMENTS

| | | | |
|---|---|---|---|
| 6,459,393 B1 | 10/2002 | Nordman | |
| 6,999,543 B1 * | 2/2006 | Trinh et al. | 375/355 |
| 7,139,345 B2 * | 11/2006 | Joo et al. | 375/354 |
| 7,236,552 B2 * | 6/2007 | Robertson et al. | 375/354 |
| 7,292,667 B1 * | 11/2007 | Beriont et al. | 375/363 |
| 2004/0062336 A1 * | 4/2004 | Kuwata et al. | 375/376 |
| 2010/0002822 A1 * | 1/2010 | Arima et al. | 375/371 |

FOREIGN PATENT DOCUMENTS

| | | |
|---|---|---|
| JP | 06-216893 | 8/1994 |
| JP | 2000-078027 | 3/2000 |

* cited by examiner

*Primary Examiner* — Chieh M Fan
*Assistant Examiner* — Eboni Hughes
(74) *Attorney, Agent, or Firm* — F. Chau & Associates, LLC

(57) ABSTRACT

A deserializer including a plurality of registers, a sync detector, and a lost bit storage unit. If there is a phase difference between an external input data packet and a recovery clock signal transmitted together with the data packet, the sync detector generates an activated sync detect signal. The lost bit storage unit detects a data bit of the data packet corresponding to an activation point of the sync detect signal. The deserializer recovers the data packet by combining the detected data bit with the data packet.

14 Claims, 12 Drawing Sheets

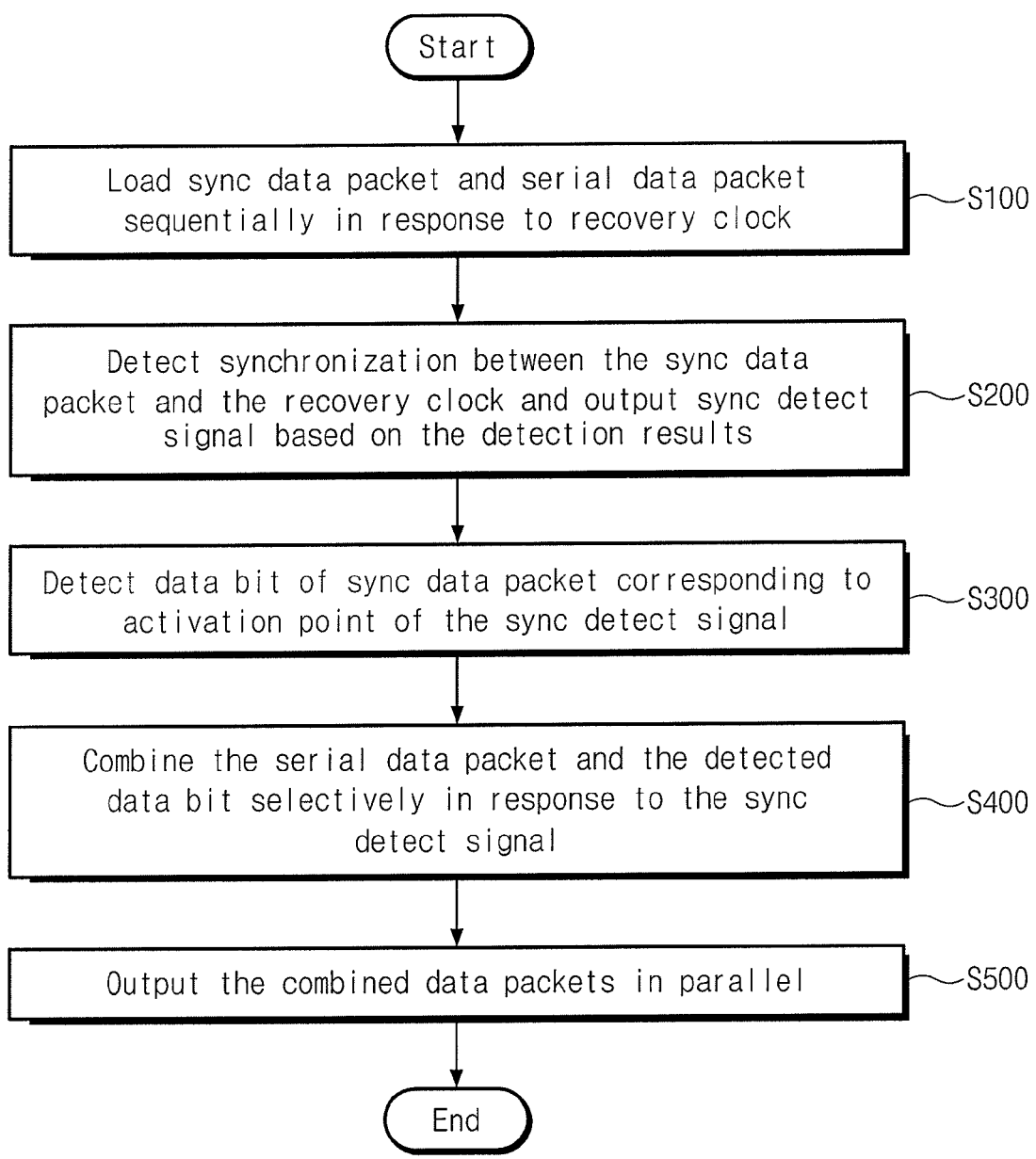

DESERIALIZER AND DATA RECOVERY METHOD

CROSS-REFERENCE TO RELATED APPLICATIONS

This U.S. non-provisional patent application claims priority under 35 U.S.C. §119 of Korean Patent Application Nos. 10-2007-17982, filed on Feb. 22, 2007, and 10-2007-53403, filed on May 31, 2007, the entire contents of which are hereby incorporated by reference.

BACKGROUND OF THE INVENTION

The present disclosure relates to deserializers and, more particularly, to deserializers capable of preventing a data bit of an external input data packet from being lost due to a phase difference between the data packet and a recovery clock used for recovering the data packet.

Schemes for data communication between electronic systems can be broadly classified into a parallel communication scheme and a serial communication scheme. The parallel communication scheme transmits/receives data in units of bytes, while the serial communication scheme transmits/receives data in units of bits.

Typically, an electronic system is designed focusing on providing a high-speed internal data processing operation. Thus, a parallel communication scheme is widely used to process a large amount of data at a time. The parallel communication scheme, however, is limited in terms of data transmission distance, is complex in hardware configuration, and requires a high cost due to the complex hardware configuration. Also, the parallel communication scheme is inefficient when transmission of a large amount of data is not required.

Therefore, a serial communication scheme is widely used to provide communication between one electronic system and another electronic system. The serial communication scheme can increase a data communication speed, because it requires fewer channels and causes a smaller interference between channel signals than the parallel communication scheme.

In the case of the high-speed serial communication scheme, a receiver receives serial data from a transmitter and has a deserializer for recovering the received serial data into parallel data. The deserializer receives the serial data along with a recovery clock signal for recovering the serial data into parallel data.

The phase of the serial data signal must be accurately synchronized with the recovery clock signal in order to accurately recover the parallel data from the serial data. There may be a skew, however, between the data signal and the recovery clock signal due to external factors, such as a transmission delay caused by the signal lines. In this case, some data bits of the serial data may be lost during the recovery of the parallel data from the serial data.

SUMMARY OF THE INVENTION

Exemplary embodiments of the present invention provide deserializers capable of recovering the loss of a data bit of an external input data packet, which occurs due to a phase difference between the data packet and a recovery clock signal used for recovering the data packet.

Exemplary embodiments of the present invention also provide data recovery methods.

Exemplary embodiments of the present invention provide deserializers including a first register, a sync detector, a lost bit storage unit, a second register, a packet combiner, and a third register.

The first register is configured to load an external sync data packet and a serial data packet sequentially in response to a recovery clock signal. The sync detector outputs a sync detect signal based on whether the sync data packet is synchronized with the recovery clock signal. The lost bit storage unit detects a data bit of the sync data packet corresponding to an activation point of the sync detect signal from the sync detector and outputs the detected data bit as a lost bit. The second register is configured to load the serial data packet from the first register. The packet combiner combines the lost bit and the serial data packet from the second register in response to the sync detect signal. The third register receives the combined data packets from the packet combiner and outputs the combined data packets in parallel.

BRIEF DESCRIPTION OF THE FIGURES

Exemplary embodiments of the present invention will be understood in more detail from the following descriptions taken in conjunction with the attached figures. In the figures:

FIG. 12 is a flowchart illustrating a data recovery method according to an exemplary embodiment of the present invention.

DETAILED DESCRIPTION OF EXEMPLARY EMBODIMENTS

Figure 1:
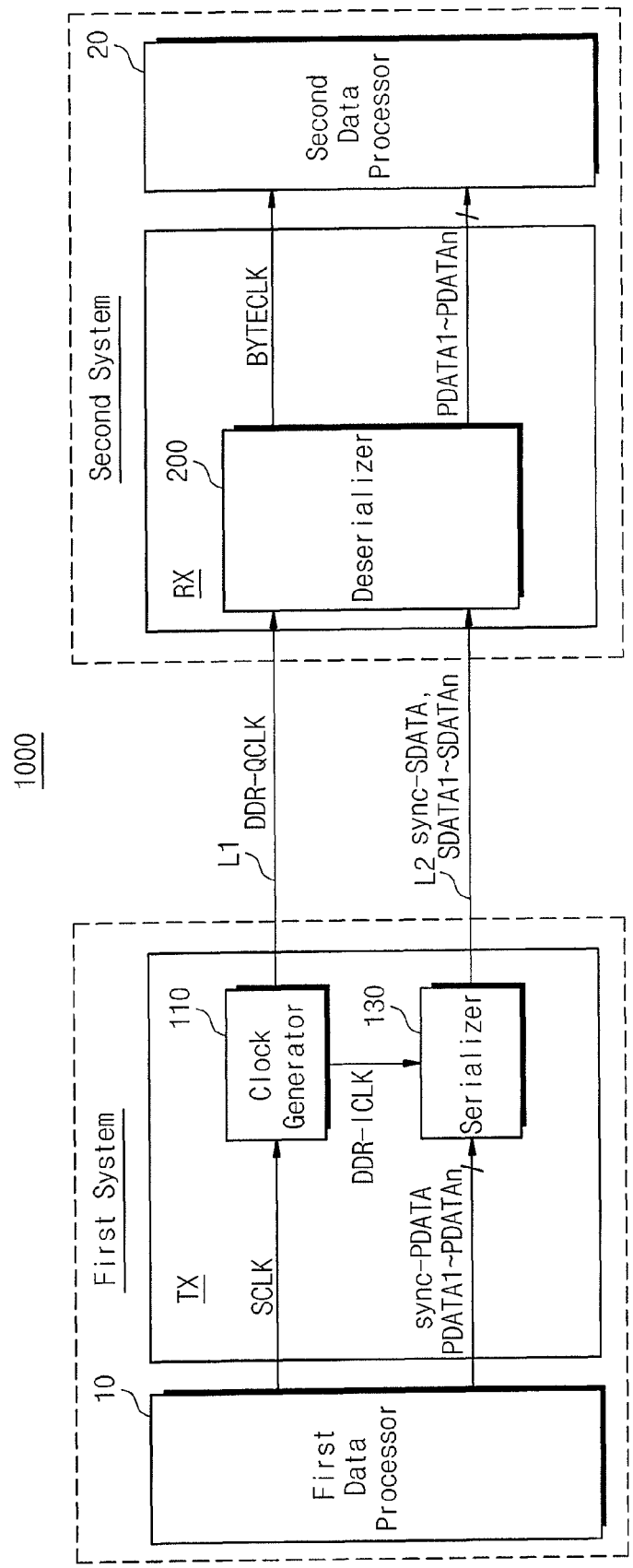
FIG. 1 is a block diagram of a system having a deserializer according to an exemplary embodiment of the present invention.

Exemplary embodiments of the present invention will be described below in more detail with reference to the accompanying drawings. The present invention may, however, be embodied in different forms and should not be construed as limited to the exemplary embodiments set forth herein. Rather, these exemplary embodiments are provided so that this disclosure will be thorough and complete, and will fully convey the scope of the present invention to those of ordinary skill in the art.

In every possible case, like reference numerals are used for referring to the same or similar elements in the description and drawings. In the following detailed description, several specific details are set forth in order to provide a thorough understanding of the present invention. It will be seen, however, to those of ordinary skill in the art that the present invention may be practiced without these specific details. In the following detailed description, well-known functions or constructions are not described in detail since they would obscure the invention in unnecessary detail.

Hereinafter, will be described an exemplary embodiment of the present invention in conjunction with the accompanying drawings.

FIG. 1 is a block diagram of a system having a deserializer according to an exemplary embodiment of the present invention.

Referring to FIG. 1, a system 1000 having a deserializer includes a first system, a second system communicating data with the first system in a serial communication scheme, and communication lines L1 and L2 for serial data communication between the first system and the second system.

The first system includes a first data processor 10 and a transmitter TX.

The first data processor 10 outputs a serial clock signal SCLK, a sync data packet sync-PDATA, and a plurality of parallel data packets PDATA1~PDATAn to the transmitter TX.

The transmitter TX includes a clock generator 110 and a serializer 130.

The clock generator 110 receives the serial clock signal SCLK and generates a transmission clock signal DDR-ICLK, and a recovery clock signal DDR-QCLK that has a 90° phase difference with respect to the transmission clock signal DDR-ICLK. The generated transmission clock signal DDR-ICLK is input into the serializer 130, and the generated recovery clock signal DDR-QCLK is transmitted through the first communication line L1 to a receiver RX of the second system.

The serializer 130 receives a 1-byte sync data packet sync-PDATA and a plurality of parallel data packets PDATA1~PDATAn from the first data processor 10 in parallel, and serializes the received packets.

For example, each of the data packets sync-PDATA and PDATA1~PDATAn includes at least two-bit data, and is output to the second communication line L2 bit by bit in a serial data communication scheme. In this exemplary embodiment, each of the data packets is assumed to include 8-bit data.

The second system includes a receiver RX and a second data processor 20.

The receiver RX recovers serial data packets sync-SDATA and SDATA1~SDATAn, which are received in units of bits through the second communication line L2, in units of bytes and outputs the resulting data to the second data processor 20.

The receiver RX includes a deserializer 200 according to an exemplary embodiment of the present invention.

The deserializer 200 receives the recovery clock signal DDR-QCLK through the first communication line L1 and also receives the serial data packets sync-SDATA and SDATA1~SDATAn through the second communication line L2.

The deserializer 200 recovers the received serial data packets sync-SDATA and SDATA1~SDATAn into parallel data packets and outputs the parallel data packets to the second data processor 20. The received serial data packets sync-SDATA and SDATA1~SDATAn are recovered in synchronization with the recovery clock signal DDR-QCLK that has a 90° phase difference with respect to the transmission clock signal DDR-ICLK.

In this exemplary embodiment, the received serial data packets sync-SDATA and SDATA1~SDATAn are recovered in synchronization with the rising/falling edges of one cycle of the recovery clock signal DDR-QCLK. This data recovery scheme is also called a Double Data Rate (DDR) scheme. The DDR scheme is used not only for data recovery but also for various operations, such as data read/write operations, in order to improve the data processing performance.

Figure 2:
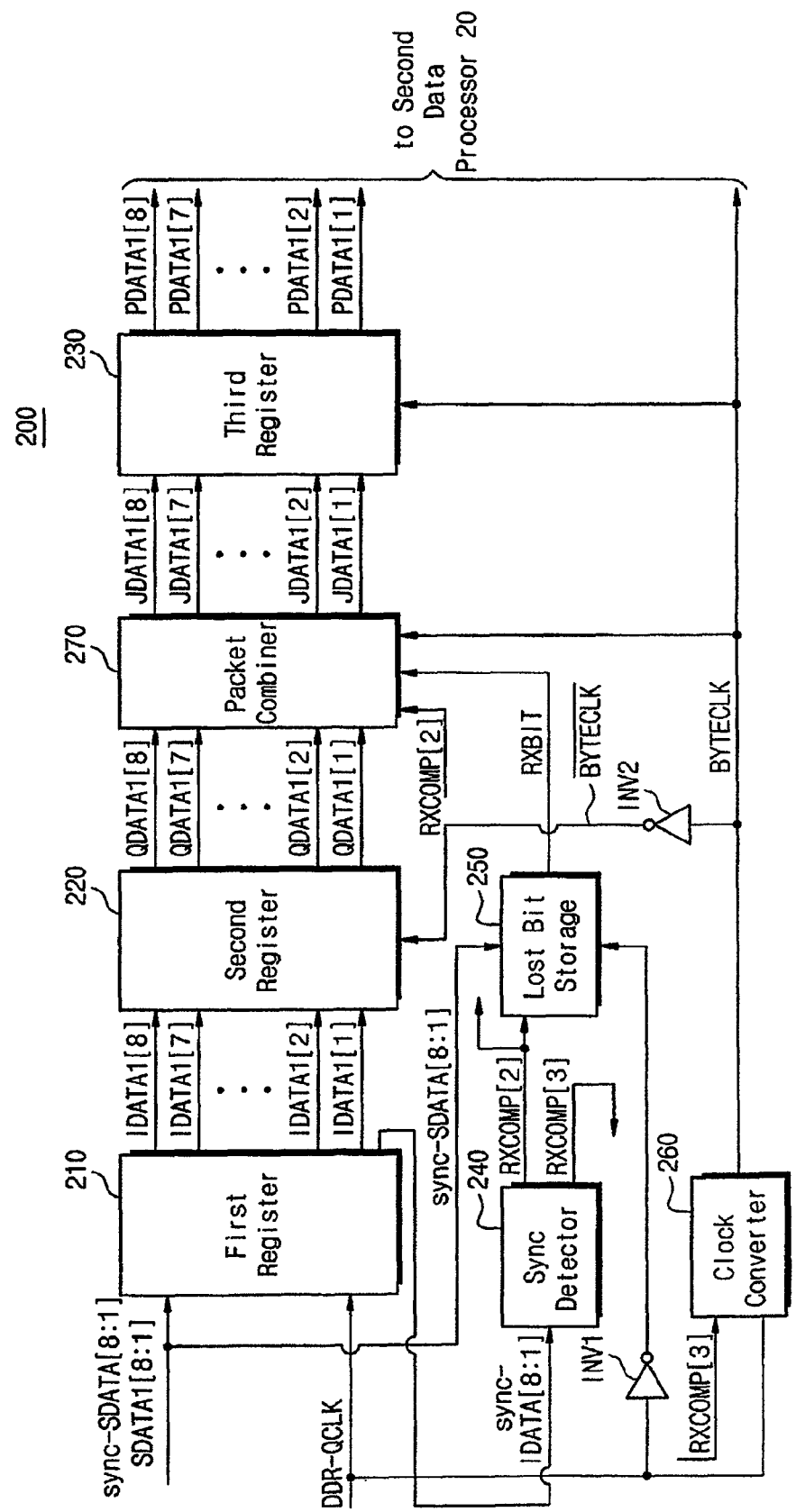
FIG. 2 is a block diagram of an exemplary embodiment of the deserializer illustrated in FIG. 1.

FIG. 2 is a block diagram of an exemplary embodiment of the deserializer 200 illustrated in FIG. 1.

Referring to FIG. 2, the deserializer 200 includes first, second, and third registers 210, 220, and 230, respectively, a sync detector 240, a lost bit storage unit 250, a clock converter 260, and a packet combiner 270.

The first register 210 receives the recovery clock signal DDR-QCLK, a serial sync data packet sync-SDATA[8:1], and a serial data packet SDATA[8:1] from the transmitter TX. Using the recovery clock signal DDR-QCLK, a serial sync data packet and a plurality of serial data packets SDATA1~SDATAn are sequentially loaded into the first register 210. The serial sync data packet sync-SDATA is loaded before the serial data packets SDATA1~SDATAn. The serial sync data packet sync-SDATA is used to determine the existence of a phase difference between the recovery clock signal DDR-QCLK and the data packets, which will be described in detail below.

Figure 3:
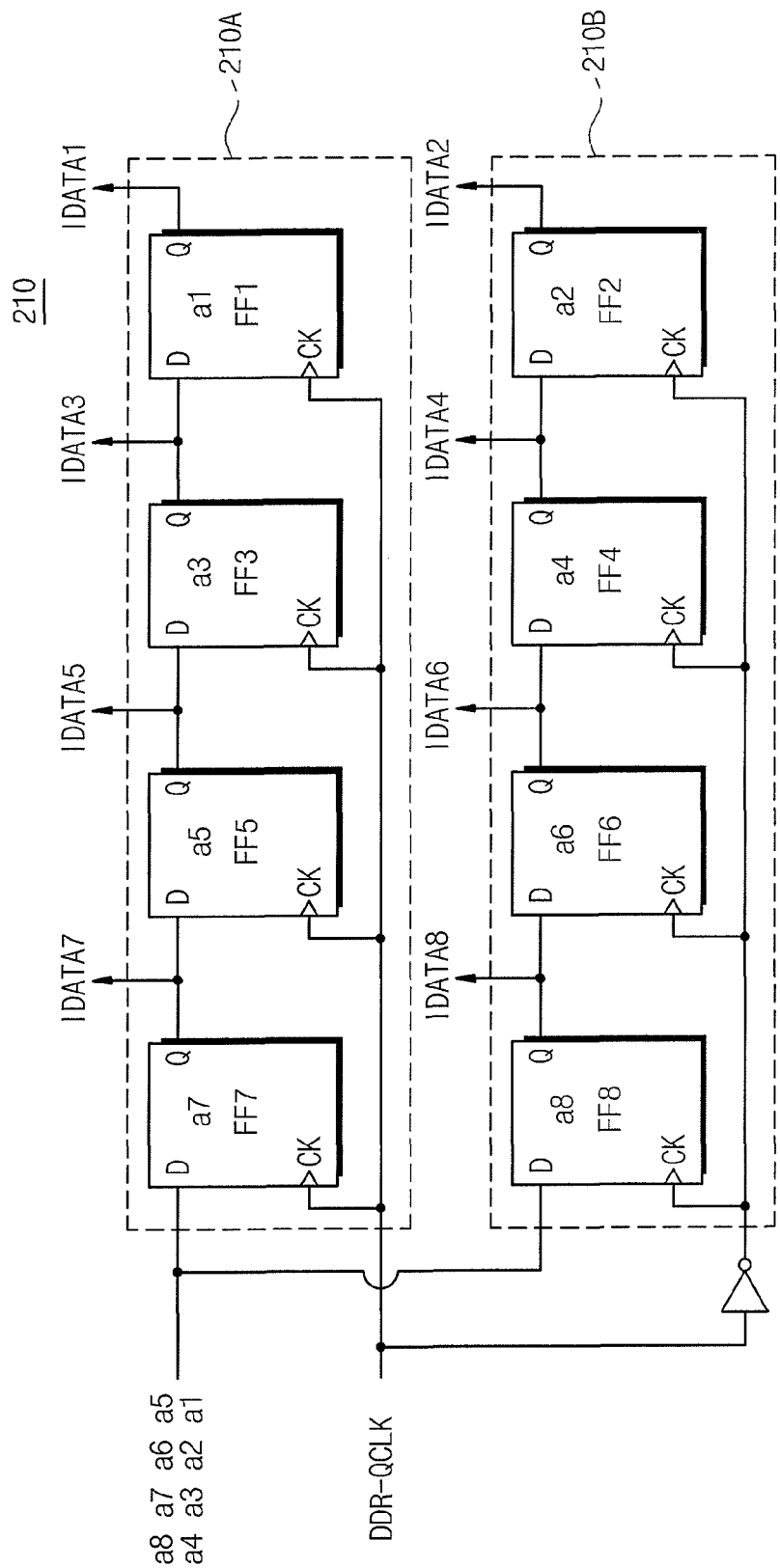
FIG. 3 is a block diagram of an exemplary embodiment of the first register illustrated in FIG. 2.

FIG. 3 is a block diagram of an exemplary embodiment of the first register 210 illustrated in FIG. 2.

Referring to FIG. 3, the first register 210 includes a first flip-flop group 210A and a second flip-flop group 210B.

The first flip-flop group 210A includes four flip-flops FF1, FF3, FF5 and FF7 that are connected in cascade. Each of the flip-flops FF1, FF3, FF5 and FF7 has an input terminal D, an output terminal Q and a clock terminal CK. The input terminal D of each flip-flop is connected to the output terminal D of the previous flip-flop, and the clock terminals of the flip-flops receive the recovery clock signal DDR-QCLK in common.

The second flip-flop group 210B is similar in construction and function to the first flip-flop group 210A. Unlike the flip-flops FF1, FF3, FF5 and FF7 of the first flip-flop group 210A, flip-flops FF2, FF4, FF6 and FF8 of the second flip-flop group 210B receive an inverted recovery clock signal DDR-QCLK in common. Thus, the first flip-flop group 210A is loaded with data bits synchronized with a rising edge of the recovery clock signal DDR-QCLK, while the second flip-flop group 210B is loaded with data bits synchronized with a falling edge of the recovery clock signal DDR-QCLK.

Consequently, the first input data bit is loaded into the flip-flop FF1 and the second input data bit is loaded into the flip-flop FF2.

Figure 4:
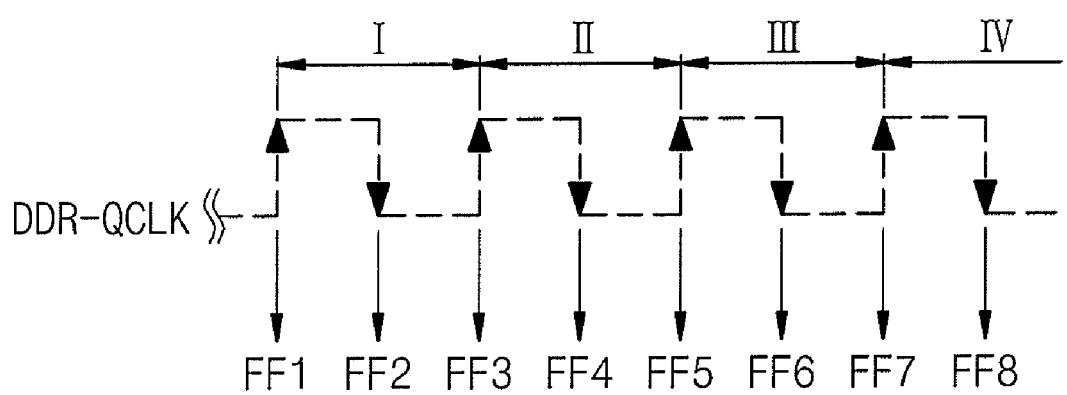
FIG. 4 is a diagram illustrating the storage order of data bits input into the first register illustrated in FIG. 2.

FIG. 4 is a diagram illustrating the storage order of data bits input into the first register 210 illustrated in FIG. 2.

In FIG. 4, it is assumed that a serial data packet of 'a8 a7 a6 a5 a4 a3 a2 a1' is input into the first register 210. Each lower case letter denotes a data bit having one of binary values '1' and '0' and it is assumed that the least significant bit (LSB) a1 is input first. The most significant bit (MSB) a8 may be input first if the order of the flip-flops is reversed.

Referring to FIG. 4, a total of eight data bits are input and the respective data bits are loaded in synchronization with the rising/falling edges of one cycle of the recovery clock signal DDR-QCLK. Thus, all the data bits are loaded for four clock cycles I, II, III and IV. That is, the odd-numbered data bits a1, a3, a5 and a7 among the input data bits are sequentially loaded into the first flip-flop group 210A in synchronization with the rising edges of the clock cycles I, II, III and IV, while the even-numbered data bits a2, a4, a6 and a8 are sequentially loaded into the second flip-flop group 210B in synchronization with the felling edges of the clock cycles I, II, III and IV.

Thus, if the first input data bit a1 is synchronized with a rising edge of the recovery clock signal DDR-QCLK, it is loaded into the flip-flop FF1. Also, the second input data bit a2 is loaded into the flip-flop FF2 and the last input data bit a8 is loaded into the flip-flop FF8.

On the other hand, if the first input data bit a1 is synchronized with a falling edge of the recovery clock signal DDR-QCLK, that is, if there is a phase difference between the serial data packet SDATA and the recovery clock signal DDR-QCLK, the data packet loaded into the first register 210 contains the first data bit of the next input data packet. This situation will be described in detail with reference to FIG. 5.

Figure 5:
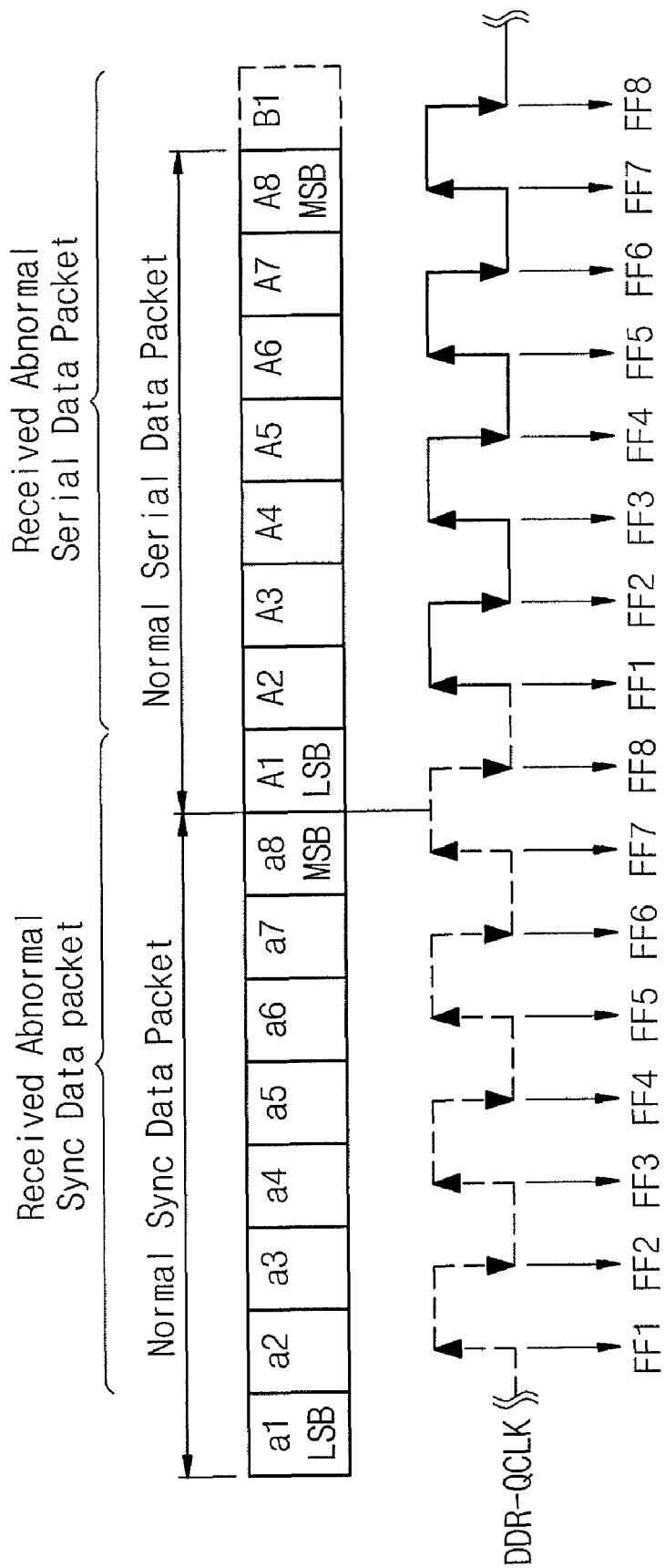
FIG. 5 is a diagram illustrating the storage order of data bits loaded into the first register when there is a phase difference between a serial data packet and a recovery clock.

FIG. 5 is a diagram illustrating the storage order of the data bits loaded into the first register 210 when there is a phase difference between the serial data packet SDATA[8:1] and the recovery clock signal DDR-QCLK.

Referring to FIG. 5, two serial data packets are successively input into the first register 210. The first serial data packet is denoted by 'a8 a7 a6 a5 a4 a3 a2 a1' and the second serial data packet is denoted by 'A8 A7 A6 A5 A4 A3 A2 A1'.

If the first data bit a1 of the first data packet is synchronized with a falling edge of the recovery clock signal DDR-QCLK, the second data bit a2 of the first data packet, ..., and the first data bit A1 of the second data packet are sequentially loaded into the first register 210 to complete the first loading operation. That is, in the first loading operation, the second data bit a2, ..., and the first data packet through the first data bit A1 of the second data packet are loaded respectively into the flip-flops FF1 through FF8.

If the first data packet is a serial sync data packet and if the second data packet is a serial data packet, the first data bit A1 of the serial sync data packet is contained in the serial sync data packet and, thus, the second system corresponding to the receiving side receives the erroneous first serial data packet.

The deserializer 200 includes the sync detector 240 capable of detecting such a lost data bit.

Referring again to FIG. 2, the sync detector 240 receives a sync data packet sync-IDATA[8:1] loaded into the first register 210, determines the normality of the received sync data packet sync-IDATA[8:1], and outputs a sync detect signal based on the determination results. In this exemplary embodiment, a sync detect signal RXCOMP[3:2] includes a first sync detect signal RXCOMP[2] and a second sync detect signal RXCOMP[3].

Depending on the logic state of the second sync detect signal RXCOMP[2] included in the sync detect signal RXCOMP[3:2], the sync detector 240 determines whether there is a phase difference between the input data packet and the recovery clock signal DDR-QCLK transmitted together with the input data packet. Hereinafter, the sync detector 240 will be described in more detail with reference to FIG. 6.

Figure 6:
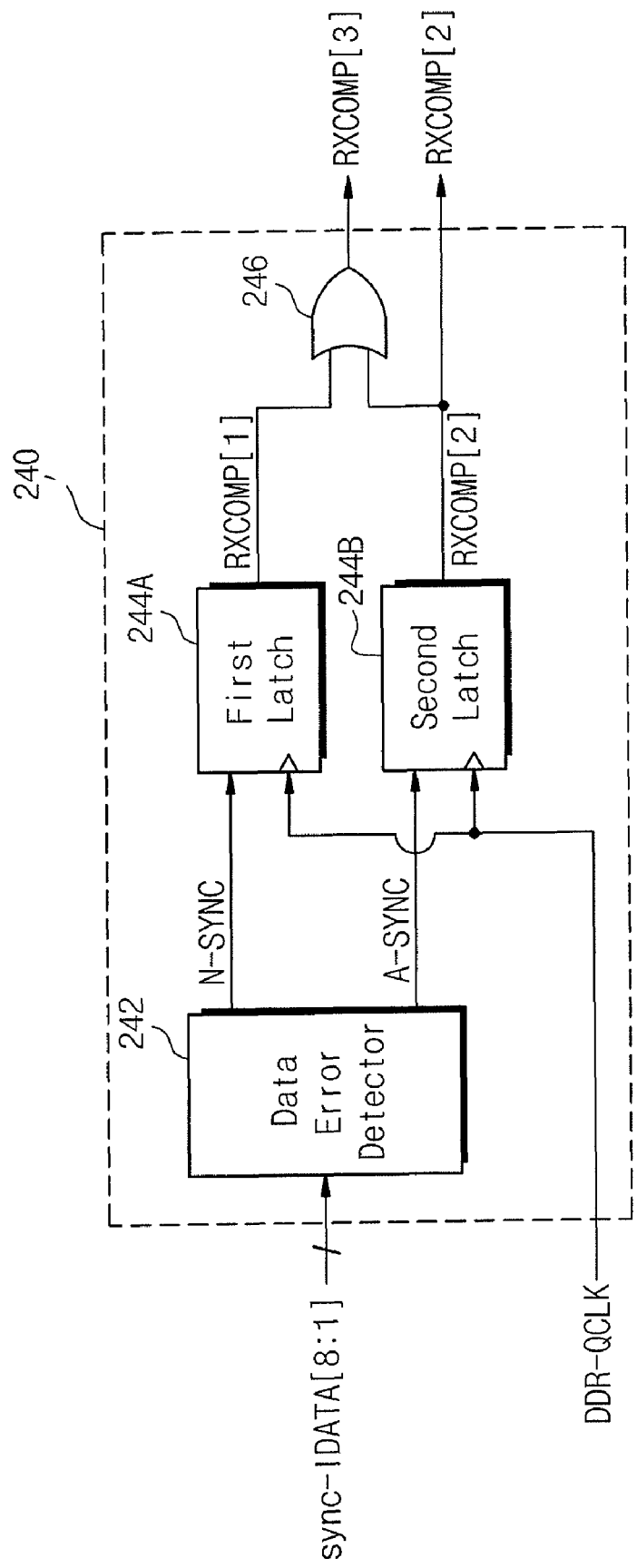
FIG. 6 is a block diagram of an exemplary embodiment of the sync detector illustrated in FIG. 2.

FIG. 6 is a block diagram of the sync detector 240 illustrated in FIG. 2.

Referring to FIG. 6, the sync detector 240 includes a data error detector 242, a first latch 244A, a second latch 244B, and an OR gate 246.

The data error detector 242 receives the sync data packet sync-IDATA[8:1] loaded into the first register 210, determines the normality of the received sync data packet sync-IDATA[8:1], and outputs a normal sync signal N-SYNC or an abnormal sync signal A-SYNC based on the determination results.

For example, the data error detector 242 compares a predetermined sync data packet negotiated with the transmitting side with an input sync data packet sync-IDATA[8:1] received from the first register 210.

If the input sync data packet sync-IDATA[8:1] is identical to the predetermined sync data packet, the data error detector 242 outputs the normal sync signal N-SYNC of logic 'H' and the abnormal sync signal A-SYNC of logic 'L'.

On the other hand, if the input sync data packet sync-IDATA[8:1] is not identical to the predetermined sync data packet, the data error detector 242 outputs the normal sync signal N-SYNC of logic 'L' and the abnormal sync signal A-SYNC of logic 'H'.

Consequently, if the serial sync data packet sync-SDATA[8:1] input into the first register 210 is synchronized with a falling edge of the recovery clock signal DDR-QCLK, the sync detector 240 outputs the normal sync signal N-SYNC of logic 'L' and the abnormal sync signal A-SYNC of logic 'H'.

The first latch 244A receives the recovery clock signal DDR-QCLK and the normal sync signal N-SYNC and latches the logic state of the normal sync signal N-SYNC in response to a rising edge of the recovery clock signal DDR-QCLK. Hereinafter, the logic state of the normal sync signal N-SYNC latched by the first latch 244A is defined as a first sync detect signal RXCOMP[1].

As shown in FIG. 6, the second latch 244B receives the recovery clock signal DDR-QCLK and the abnormal sync signal A-SYNC and latches the logic state of the abnormal sync signal A-SYNC in response to a rising edge of the recovery clock signal DDR-QCLK. Hereinafter, the logic state of the abnormal sync signal A-SYNC latched by the second latch 244B is defined as a second sync detect signal RXCOMP[2]. The second sync detect signal RXCOMP[2] is output to the lost bit storage unit 250.

The OR gate 246 receives the first sync detect signal RXCOMP[1] and the second sync detect signal RXCOMP[2] and performs an OR operation on the received sync detect signals to output a third sync detect signal RXCOMP[3]. The third sync detect signal RXCOMP[3] is used to generate a byte clock signal BYTECLK from the clock converter 260.

That is, the sync detector 240 compares the predetermined sync data packet with the sync data packet sync-IDATA[8:1] loaded into the first register 210, and outputs the second sync detect signal RXCOMP[2] of logic 'H' if the predetermined sync data packet is not identical to the sync data packet sync-IDATA[8:1].

Referring again to FIG. 2, the lost bit storage unit 250 retains (or holds) the data bit of the serial sync data packet sync-SDATA[8:1] at the activation point of the second sync detect signal RXCOMP[2]. It should be noted that the retained data bit is the first data bit of the first serial data packet SDATA[8:1].

Figure 7:
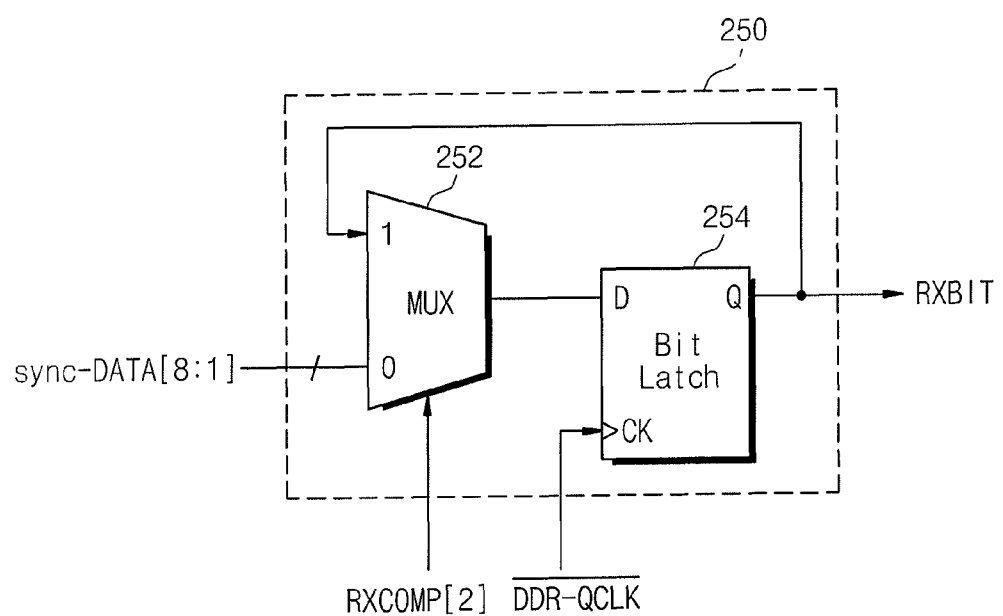
FIG. 7 is a block diagram of an exemplary embodiment of the lost bit storage unit illustrated in FIG. 2.

FIG. 7 is a block diagram of the lost bit storage unit 250 illustrated in FIG. 2.

Referring to FIG. 7, the lost bit storage unit 250 includes a multiplexer (MUX) 252 and a bit latch 254.

The MUX 252 receives, bit by bit, a serial sync data packet sync-SDATA[8:1] and a data bit latched in the bit latch 254. Also, depending on the activation/deactivation of the second sync detect signal RXCOMP[2], the MUX 252 selectively outputs the serial sync data packet sync-SDATA[8:1] and the data bit stored in the bit latch 254. In this exemplary embodiment, if the second sync detect signal RXCOMP[2] is logic 'L' the MUX 252 outputs data bits of the serial sync data packet sync-SDATA[8:1] sequentially bit by bit. On the other hand, if the second sync detect signal RXCOMP[2] is logic 'H', the MUX 252 receives and outputs a data bit latched in the bit latch 254 when the second sync detect signal RXCOMP[2] changes from logic 'L' to logic 'H'.

In synchronization with a tailing edge of the recovery clock signal DDR-QCLK, the bit latch 254 latches the data bits from the MUX 252 sequentially bit by bit.

In this exemplary embodiment, in response to the deactivated second sync detect signal RXCOMP[2], the lost bit storage unit 250 sequentially latches the data bits of the serial sync data packet sync-SDATA[8:1] synchronized with a falling edge of the recovery clock signal DDR-QCLK. Thereafter, in response to the activated second sync detect signal RXCOMP[2], the lost bit storage unit 250 retains a data bit RXBIT of the serial sync data packet sync-SDATA[8:1] at the activation point of the second sync detect signal RXCOMP[2]. Hereinafter, the data bit of the serial sync data packet sync-SDATA[8:1] corresponding to the activation point of the second sync detect signal RXCOMP[2] will be referred to as 'lost bit RXBIT'.

Referring again to FIG. 2, the clock converter 260 converts the recovery clock signal DDR-QCLK into a byte clock signal BYTECLK in response to the third sync detect signal RXCOMP[3] activated to logic 'H'.

The byte clock signal BYTECLK is provided to the second and third registers 220 and 230. The second register 220 receives the byte clock signal BYTECLK inverted by an inverter INV2. That is, the second register 220 starts data packet loading in response to a felling edge of the byte clock signal BYTECLK. Herein, the frequency of the byte clock signal BYTECLK is set to ¼ of the frequency of the recovery clock signal DDR-QCLK.

The second register 220 is loaded with a first parallel data packet IDATA[8:1] in response to a falling edge of the byte clock signal BYTECLK.

In response to the second sync detect signal RXCOMP[2], the packet combiner 270 converts a second parallel data packet QDATA[8:1] into a third parallel packet JDATA[8:1].

While the second sync detect signal RXCOMP[2] is in a deactivation state, for example, logic 'L' the packet combiner 270 outputs the second parallel data packet QDATA[8:1] as it is. On the other hand, when the second sync detect signal RXCOMP[2] changes from the deactivation state to the activation state, for example, logic 'H', the packet combiner 270 starts to combine the second parallel data packet QDATA[8:1]. Hereinafter, the packet combiner 270 will be described in more detail with reference to FIG. 8.

Figure 8:
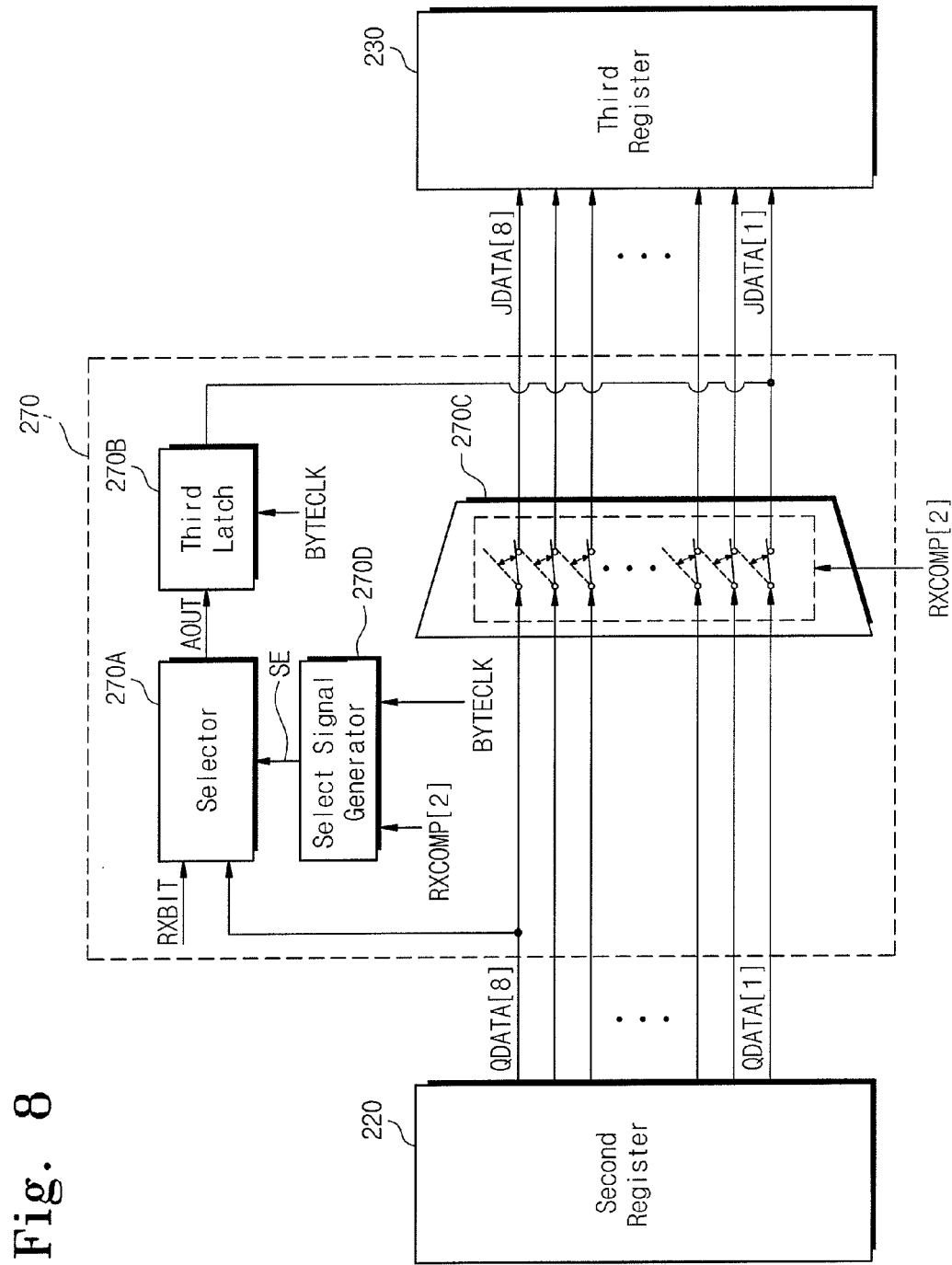
FIG. 8 is a block diagram of an exemplary embodiment of the packet combiner illustrated in FIG. 2.

FIG. 8 is a block diagram of an exemplary embodiment of the packet combiner 270 illustrated in FIG. 2.

Referring to FIG. 8, the packet combiner 270 includes a selector 270A, a third latch 270B, a multiplexer 270C, and a select signal generator 270D.

Depending on the logic state of a select signal SE from the select signal generator 270D, the selector 270A selects and outputs one of the lost bit RXBIT from the lost bit storage unit 250 of FIG. 2 and the data bit QDATA[8] from the second register 220. For example, the selector 270A outputs the lost bit RXBIT from the lost bit storage unit 250 in response to the deactivated logic 'L' select signal SE. On the other hand, the selector 270A outputs the eighth data bit QDATA[8] from the second register 220 in response to the activated logic 'H' select signal SE.

In response to a rising edge of the byte clock signal BYTECLK, the third latch 270B selects and outputs one of the lost bit RXBIT from the selector 270A and the data bit QDATA[8] from the second register 220 as the first data bit JDATA[1] of the third register 230.

Depending on the logic state of the second sync detect signal RXCOMP[2], the multiplexer 270C determines the path through which the data packet QDATA[8:1] loaded in the second register 220 is input into the third register 230. For example, if the second sync detect signal RXCOMP[2] is logic 'L', the multiplexer 270C outputs the output data bits QDATA[8:1] of the second register 220 to the third register 230 as they are.

On the other hand, if the second sync detect signal RXCOMP[2] is logic 'H', an output terminal of the multiplexer 270C for the data bit QDATA[1]/QDATA[2]/QDATA[3]/.../QDATA[7] from the second register 220 is connected to the data bit JDATA[2]/JDATA[3]/JDATA[4]/.../JDATA[8] input terminal of the third register 230. Also, the data bit QDATA[8] latched in the third latch 270B is input to the data bit JDATA[1] input terminal of the third register 230.

The select signal generator 270D outputs the select signal SE in response to the second sync detect signal RXCOMP[2] and the byte clock signal BYTECLK.

Figure 9:
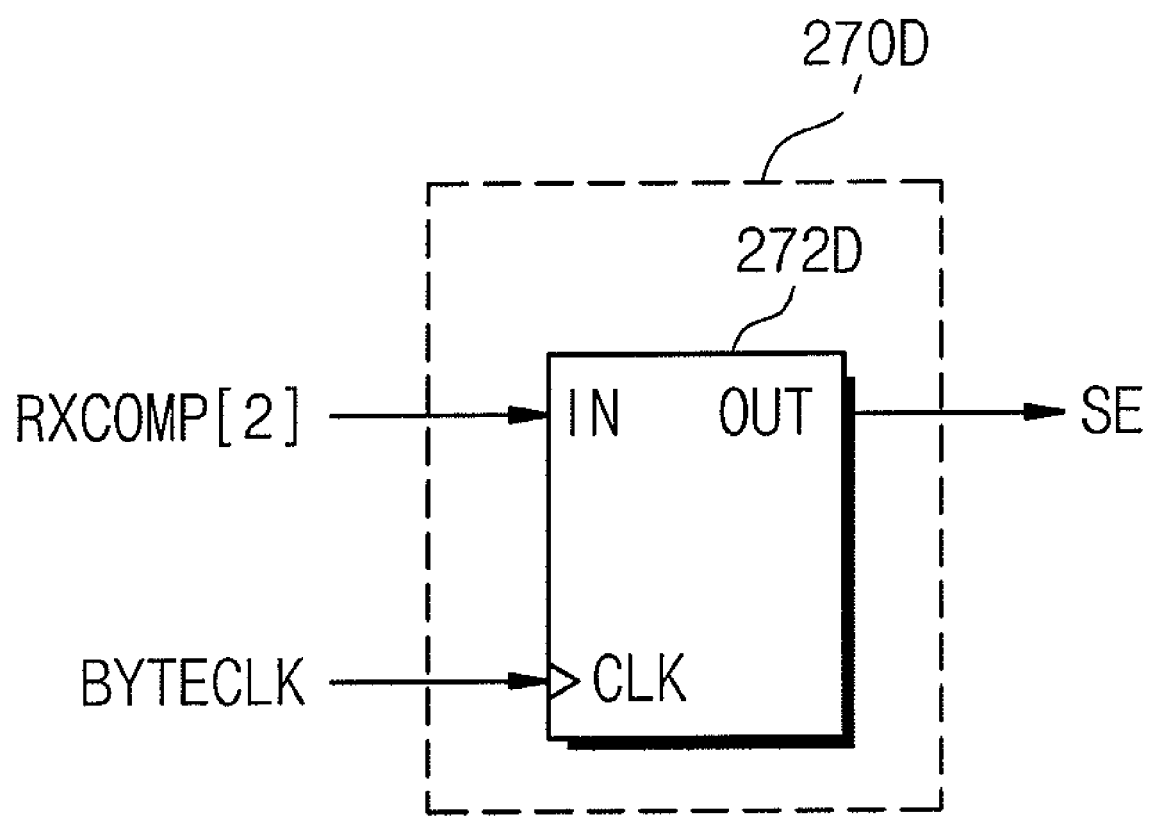
FIG. 9 is a schematic diagram of an exemplary embodiment of the select signal generator illustrated in FIG. 8.

FIG. 9 is a schematic diagram of an exemplary embodiment of the select signal generator 270D illustrated in FIG. 8.

As illustrated in FIG. 9, the select signal generator 270D may be implemented using a flip-flop 272D. The select signal generator 270D synchronizes the change point of the logic state of the second sync detect signal RXCOMP[2] with the byte clock signal BYTECLK. For example, the select signal generator 270D synchronizes the change point from logic 'L' to logic 'H' of the second sync detect signal RXCOMP[2] with the first rising edge of the byte clock signal BYTECLK.

Consequently, the select signal generator 270D outputs the logic 'L'/'H' select signal SE before/after the generation of the first clock of the byte clock signal BYTECLK.

The third register 230 shown in FIG. 8 is loaded with the data packet combined by the packet combiner 270 in response to a rising edge of the byte clock signal BYTECLK.

Thereafter, the data packet loaded into the third register 230 is recovered into the final parallel data packet PDATA[8:1] to be output to the second data processor 20 (see FIG. 1).

Hereinafter, an operation of the deserializer 200 will be described with reference to FIG. 10.

Figure 10:
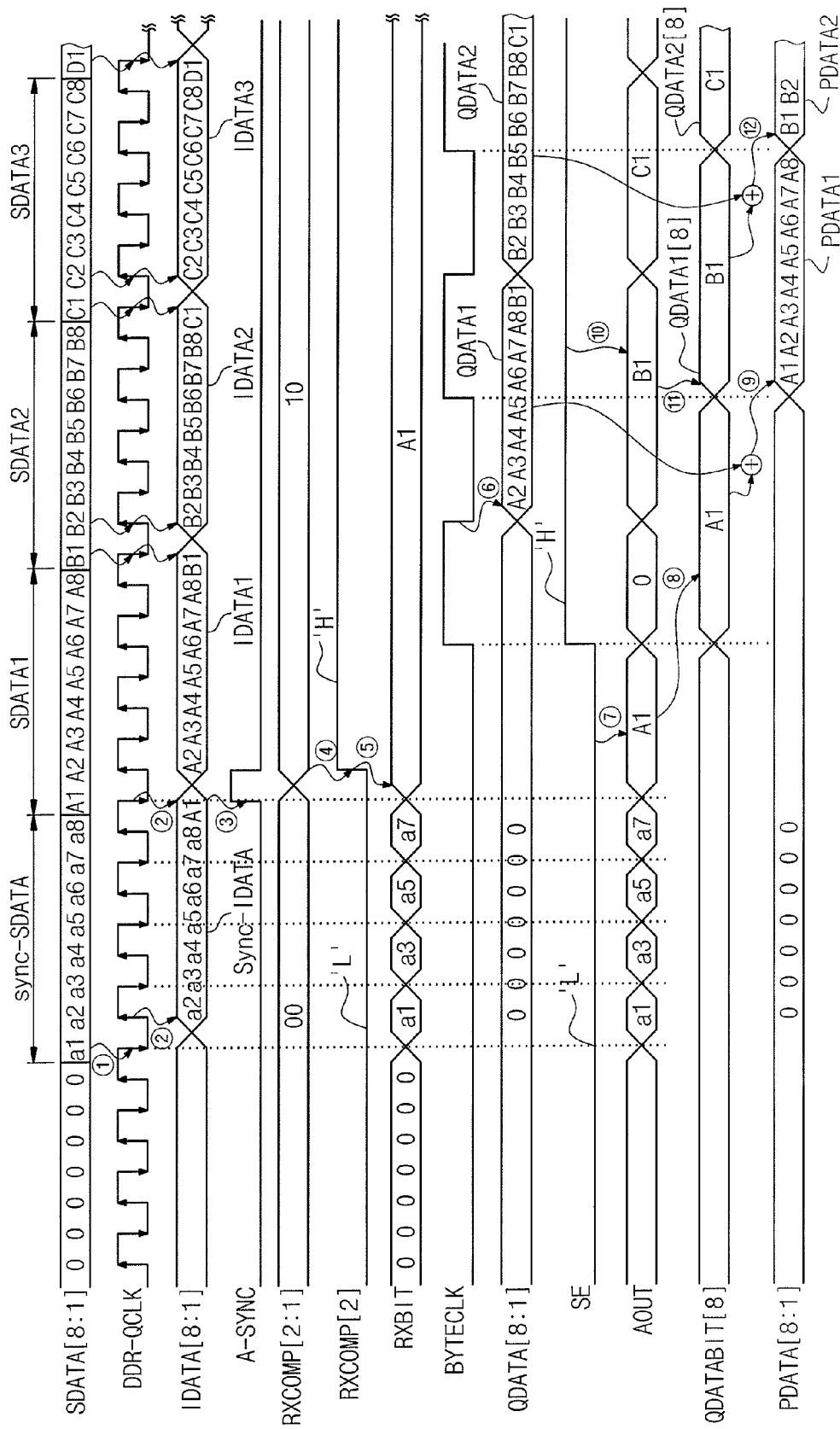
FIG. 10 is a timing diagram illustrating an operation of the deserializer when there is a phase difference between a recovery clock signal and a serial data packet, according to an exemplary embodiment of the present invention.

FIG. 10 is a timing diagram illustrating an operation of the deserializer 200 when there is a phase difference between the recovery clock signal DDR-QCLK and the serial data packet SDATA[8:1], according to an exemplary embodiment of the present invention. In FIG. 10, 'AOUT' is a signal representing the data bit output from the selector 270A.

Referring to FIG. 10, the serial sync data packet sync-SDATA[8:1] is input into the first register 210 shown in FIG. 2. At this point, the first data bit a1 of the serial sync data packet sync-SDATA[8:1] is synchronized with a falling edge of the recovery clock signal DDR-QCLK (①). Thus, the second data bit a2 of the serial sync data packet sync-SDATA through the first data bit A1 of the first serial data packet. SDATA1 are sequentially loaded into the first register 210 (②).

Thereafter, the data error detector 242 of the sync detector 240 outputs the logic 'H' abnormal sync signal A-SYNC according to the sync data packet sync-IDATA (a2 a3 a4 a5 a6 a7 A1) loaded into the first register 210 (③). Thus, the sync detector 240 outputs the second sync detect signal RXCOMP[2] activated to logic 'H'(④).

While the second sync detect signal RXCOMP2 is in a deactivation state of logic 'L', the lost bit storage unit 250 latches data bits a1, a2, a5, and a7 bit by bit in response to the falling edges of the recovery clock signal DDR-QCLK. At this point, the lost bit storage unit 250 retains the data bit A1 as the lost bit RXBIT at the deactivation point of the sync detect signal RXCOMP to logic 'H' (⑤).

The first data packet IDATA1 from the first register 210 is loaded into the second register 220 in synchronization with a falling edge of the byte clock signal BYTECLK (⑥).

Thereafter, the packet combiner 270 combines the data bits QDATA1[8:2] of the first data packet QDATA1 and the lost bit RXBIT (A1) from the lost bit storage unit 250 to generate the data packet JDATA[8:1], and outputs the generated data packet JDATA[8:1] to the third register 230.

The selector 270A of the packet combiner 270 outputs the lost bit AOUT (A1) in response to the logic 'L' select signal SE from the select signal generator 270D (⑦). The output lost bit AOUT (A1) is latched in the third latch 270B in synchronization with a rising edge of the byte clock signal BYTECLK (⑧). The third latch 270B outputs the lost bit AOUT (A1) to an output terminal of the first data bit JDATA [1] input into the third register 230. The lost bit A1 output through the third latch 270B is combined with the data bits QDATA1[8:2] of the first data packet loaded into the second register 220, and the resulting data are output to the third register 230. Consequently, the third register 230 outputs the first parallel data packet PDATA1 obtained by recovering the lost data bit A1 (⑨).

Thereafter, the second data packet QDATA2 is recovered as follows:

The selector 270A of the packet combiner 270 outputs the eighth data bit QDATA1[8] (B1) of the first data packet loaded into the second register 220 in response to the logic 'H' select signal SE from the select signal generator 270D (⑩). The output data bit QDATA1[8] (B1) is latched in the third latch 270B in synchronization with a rising edge of the byte clock signal BYTECLK (⑪). The eighth data bit QDATA1[8] (B1) output through the third latch 270B is combined with the data bits QDATA2[8:2] of the second data packet loaded into the second register 220, and the resulting data are output to the third register 230. Consequently, the third register 230 outputs the recovered second parallel data packet PDATA2 (⑫).

The remaining data packets are recovered in the same manner as the second data packet QDATA2, and thus further description will be omitted for conciseness.

Figure 11:
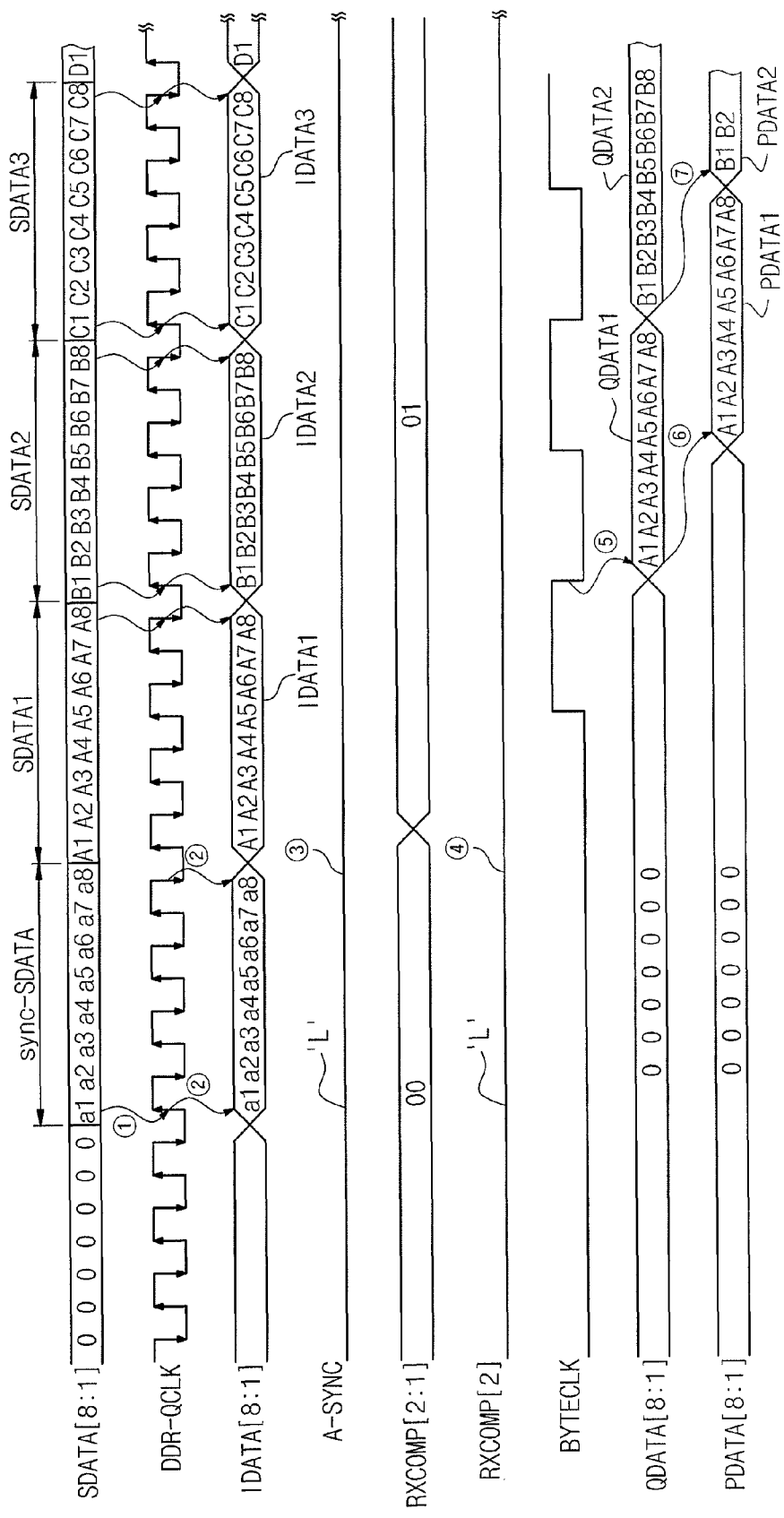
FIG. 11 is a timing diagram illustrating an operation of the deserializer when there is no phase difference between a recovery clock and a serial data packet, according to an exemplary embodiment of the present invention.

FIG. 11 is a timing diagram illustrating an operation of the deserializer 200 shown in FIG. 2 when there is no phase difference between the recovery clock signal DDR-QCLK and the serial data packet SDATA[8:1], according to an exemplary embodiment of the present invention.

Referring to FIG. 11, the serial sync data packet sync-SDATA[8:1] is input into the first register 210. At this point, the first data bit a1 of the serial sync data packet sync-SDATA [8:1] is synchronized with a rising edge of the recovery clock signal DDR-QCLK (①). Thus, the first to last data bits a1 to a8 of the serial sync data packet sync-SDATA[8:1] are sequentially loaded into the first register 210 (②). That is, the first register 210 is loaded with the normal serial sync data packet sync-SDATA[8:1].

Thereafter, the data error detector 242 of the sync detector 240 outputs the logic 'L' abnormal sync signal A-SYNC in response to the sync data packet sync-IDATA[8:1] (a1 a2 a3 a4 a5 a6 a7 A1) loaded into the first register 210 (③). Thus, the sync detector 240 retains the second sync detect signal RXCOMP[2] deactivated to logic 'L'(④).

The first data packet IDATA1 received from the first register 210 is loaded into the second register 220 in synchronization with a falling edge of the byte clock signal BYTECLK (⑤).

Thereafter, the packet combiner 270 receives the first data packet QDATA1 loaded into the second register 220 and outputs the received first data packet QDATA1 to the third register 230 as it is. The third register 230 outputs the loaded first data packet as the first parallel data packet PDATA1 (⑥).

In the same way as above, the remaining data packets SDATA2~SDATAn following the first serial data packet SDATA1 are output as the parallel data packets PDATA2~PDATAn through the third register 230 (⑦).

FIG. 12 is a flowchart illustrating a data recovery method according an exemplary embodiment of the present invention.

Referring to FIG. 12, the external sync data packet sync-SDATA[8:1] and the serial data packet SDATA[8:1] are sequentially loaded in response to the recovery clock signal DDR-QCLK, in step S100. In step S200, whether the sync data packet sync-SDATA[8:1] is synchronized with the recovery clock signal DDR-QCLK is detected and the sync detect signal RXCOMP[2] is output based on the detection results. In step S300, the data bit of the sync data packet corresponding to the activation point of the sync detect signal RXCOMP[2] is detected and the detected data bit is output as the lost bit. In step S400, the serial data packet and the lost bit are combined selectively in response to the sync detect signal RXCOMP[2]. In step S500, the combined data packets are output in parallel.

As described above, the deserializer of an exemplary embodiment of the present invention can recover the loss of the data bit of the external input data packet, which occurs due to a phase difference between the data packet and the recovery clock signal, for recovering the data packet.

The above-disclosed subject matter is to be considered illustrative, and not restrictive, and the appended claims are intended to cover all such modifications, enhancements, and other exemplary embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A deserializer comprising:
    a first register configured to load an external sync data packet and a serial data packet sequentially in response to a recovery clock signal;
    a sync detector outputting a sync detect signal based on whether the sync data packet is synchronized with the recovery clock signal;
    a lost bit storage unit detecting a data bit of the sync data packet or the serial data packet corresponding to an activation point of the sync detect signal from the sync detector and outputting the detected data bit as a lost bit;
    a second register configured to load the serial data packet from the first register;
    a packet combiner combining the lost bit and the serial data packet from the second register in response to the sync detect signal; and
    a third register outputting the data packets from the packet combiner in parallel, wherein the first register is configured to load the sync data packet and the serial data packet in response to rising/falling edges of one cycle of the recovery clock signal in units of data bits, and the first register comprises:
    a first flip-flop group including a plurality of flip-flops connected in cascade and storing odd-numbered data bits of the sync data packet in response to a rising edge of the recovery clock signal; and
    a second flip-flop group including a plurality of flip-flops connected in cascade and storing even numbered data bits of the sync data packet in response to a falling edge of the recovery clock signal, and wherein the first register is configured to load a first to last data bits of the sync data packet if the first data bit of the sync data packet is synchronized with the rising edge of the recovery clock signal, and the first register is configured to load the second data bit of the sync data packet to a first data bit of the serial data packet if the first data bit of the sync data packet is synchronized with the falling edge of the recovery clock signal.

2. The deserializer of claim 1, wherein the sync detector comprises:
a data error detector comparing the sync data packet from the first register with a reference data packet and outputting one of a normal sync signal and an abnormal sync signal based on the comparison results;
a first latch receiving the normal sync signal and latching a logic state of the normal sync signal;
a second latch receiving the abnormal sync signal, latching a logic state of the abnormal sync signal, and outputting the latched logic state as the sync detect signal; and
an OR gate performing an OR operation on the logic state of the normal sync signal and the logic state of the abnormal sync signal and outputting the OR operation results.

3. The deserializer of claim 2, wherein if the sync data packet from the first register is different from the reference data packet, the data error detector outputs the normal sync signal of a first logic state and the abnormal sync signal of a second logic state that is the inversion of the first logic state.

4. The deserializer of claim 2, wherein the lost bit storage comprises:
a multiplexer selectively outputting the data bit of the sync data packet and a feedback data bit according to the sync detect signal from the second latch; and
a bit latch latching the output data bits from the multiplexer sequentially in synchronization with a falling edge of the recovery clock signal and outputting the latched data bit to the multiplexer as the feedback data bit.

5. The deserializer of claim 4, wherein the multiplexer selects and outputs the feedback data bit in response to the activated sync detect signal.

6. The deserializer of claim 1, further comprising a clock converter receiving and converting the recovery clock signal into a byte clock signal with a frequency that is ¼ of the frequency of the recovery clock signal.

7. The deserializer of claim 6, wherein the second register is configured to load the data packet from the first register in response to a falling edge of the byte clock signal, and the third register is configured to load the data packet from the second register in response to a rising edge of the byte clock signal.

8. The deserializer of claim 1, wherein the sync detector outputs a deactivated sync detect signal if the sync data packet is synchronized with the recovery clock signal, and outputs an activated sync detect signal if the sync data packet is not synchronized with the recovery clock signal.

9. The deserializer of claim 8, wherein the packet combiner outputs a serial data packet loaded into the second register in response to the deactivated sync detect signal.

10. The deserializer of claim 9, wherein the packet combiner combines the serial data packet with the lost bit in response to the activated sync detect signal.

11. A data recovery method comprising:
loading an external sync data packet and a serial data packet sequentially in response to a recovery clock signal;
detecting whether the sync data packet is synchronized with the recovery clock signal and outputting a sync detect signal based on the detection results;
detecting a data bit of the sync data packet or the serial data packet corresponding to an activation point of the sync detect signal; and
combining the serial data packet with the detected data bit and outputting the resulting data in parallel in response to the sync detect signal,
wherein the serial data packet is selectively combined with the detected data bit in response to the sync detect signal, wherein the sync data packet and the serial data packet are loaded in response to rising/falling edges of one cycle of the recovery clock signal in units of data bits, wherein odd-numbered data bits of the sync data packet are loaded in response to a rising edge of the recovery clock signal, and even-numbered data bits of the sync data packet are loaded in response to a falling edge of the recovery clock signal, and wherein a first to last data bits of the sync data packet are loaded if the first data bit of the sync data packet is synchronized with the rising edge of the recovery clock signal, and the second data bit of the sync data packet to a first data bit of the serial data packet are loaded if the first data bit of the sync data packet is synchronized with the falling edge of the recovery clock signal.

12. The data recovery method of claim 11, wherein the sync detect signal is deactivated if the sync data packet is synchronized with the recovery clock signal, and the sync detect signal is activated if the sync data packet is not synchronized with the recovery clock signal.

13. The data recovery method of claim 12, wherein the serial data packet is output in parallel in response to the deactivated sync detect signal.

14. The data recovery method of claim 12, wherein the serial data packet is output in parallel in combination with the detected data bit in response to the activated sync detect signal.

* * * * *